United States Patent
Nentwig

(10) Patent No.: US 7,991,074 B2
(45) Date of Patent: Aug. 2, 2011

(54) PROCESSING TRANSMISSION SIGNALS IN RADIO TRANSMITTER

(75) Inventor: Markus Nentwig, Helsinki (FI)

(73) Assignee: Nokia Corporation, Espoo (FI)

( * ) Notice: Subject to any disclaimer, the term of this patent is extended or adjusted under 35 U.S.C. 154(b) by 724 days.

(21) Appl. No.: 12/071,376

(22) Filed: Feb. 20, 2008

(65) Prior Publication Data

US 2009/0161793 A1   Jun. 25, 2009

(30) Foreign Application Priority Data

Dec. 21, 2007   (FI) .................................... 20075958

(51) Int. Cl.
  *H04K 1/02* (2006.01)
  *H04L 25/03* (2006.01)
  *H04L 25/49* (2006.01)
(52) U.S. Cl. ........ 375/297; 375/300; 375/302; 375/229; 375/232; 375/285; 455/102
(58) Field of Classification Search .................. 375/297, 375/295, 300, 302, 229, 230, 232, 285; 455/102
  See application file for complete search history.

(56) References Cited

U.S. PATENT DOCUMENTS

| 7,400,865 | B2 | 7/2008 | Jarvinen | |
| 7,792,214 | B2 * | 9/2010 | Matsuura et al. | 375/297 |
| 2006/0178120 | A1 | 8/2006 | Puma | |
| 2006/0205366 | A1 | 9/2006 | Arayashiki | |
| 2006/0209986 | A1 | 9/2006 | Jensen et al. | |

FOREIGN PATENT DOCUMENTS

WO   2006/085177   8/2006

OTHER PUBLICATIONS

Woo et al.: "A Novel Linear Polar Transmitter Architecture Using Low-Power Analog Predistortion for EDGE Applications"; Proceedings of Asia-Pacific Microwave Conference 2006; Jan. 12, 2006; pp. 1-4.
Groe, J; "Polar Transmitters for Wireless Communications"; IEEE Communications Magazine; Sep. 2007;pp. 58-63.
International Search Report, PCT/FI2008/050752 dated Jul. 14, 2009.

* cited by examiner

*Primary Examiner* — Phuong Phu
(74) *Attorney, Agent, or Firm* — Squire, Sanders & Dempsey (US) LLP

(57) ABSTRACT

A method, apparatus, and computer program is presented for use in a radio transmitter using a polar transmitter structure in which a transmission signal is separated into an amplitude component and a phase component. The transmission signal includes transmission symbols distributed to a number of transmission resource blocks allocated to the radio transmitter for transmission. The amplitude component of the transmission signal is low-pass filtered in a low-pass filter configured by filtering parameters selected according to the number of transmission resource blocks allocated to the radio transmitter. Then, the low-pass filtered amplitude component is used in power supply of a power amplifier configured to power-amplify a phase component of the transmission signal.

29 Claims, 3 Drawing Sheets

PROCESSING TRANSMISSION SIGNALS IN RADIO TRANSMITTER

FIELD

The invention relates to the field of radio transmitters and, particularly, to processing transmission signals in a radio transmitter.

BACKGROUND

In radio transmitters, a transmission signal, i.e. the signal being transmitted, is amplified in a radio frequency power amplifier which amplifies the transmission signal to a level suitable for transmission over an air interface to a radio receiver. The level of the power-amplified transmission signal should be high enough to enable the radio receiver to decode information contained in the transmission signal.

In a polar transmitter structure, the transmission signal is separated into an amplitude component and phase component. The phase component is up-converted to a radio frequency and then applied to an input node of the power amplifier. The amplitude component is applied to a power supply signal path in the transmitter and used to provide the power amplifier with a power supply signal.

Components in the power supply signal path induce noise to the amplitude component of the transmission signal, and the noise appears as additional amplitude modulation in the transmission signal after the power-amplification. In modern wireless telecommunication systems using variable-bandwidth transmissions, spurious emissions caused by the noise result in interference between adjacent frequency resource blocks allocated to different communication links and, thereby, reduce the overall capacity of the system. Accordingly, there is a need to reduce the noise power in the power supply signal to obtain more effective power-amplification.

BRIEF DESCRIPTION

According to an aspect of the present invention, there is provided a method as specified in claim 1.

According to another aspect of the present invention, there is provided an apparatus as specified in claim 14.

According to another aspect of the present invention, there is provided an apparatus as specified in claim 27.

According to yet another aspect of the present invention, there is provided a computer program product embodied on a computer readable distribution medium as specified in claim 28.

Embodiments of the invention are defined in the dependent claims.

LIST OF DRAWINGS

Embodiments of the present invention are described below, by way of example only, with reference to the accompanying drawings, in which FIG. 1 illustrates a general polar transmitter structure;

DESCRIPTION OF EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Figure 1:
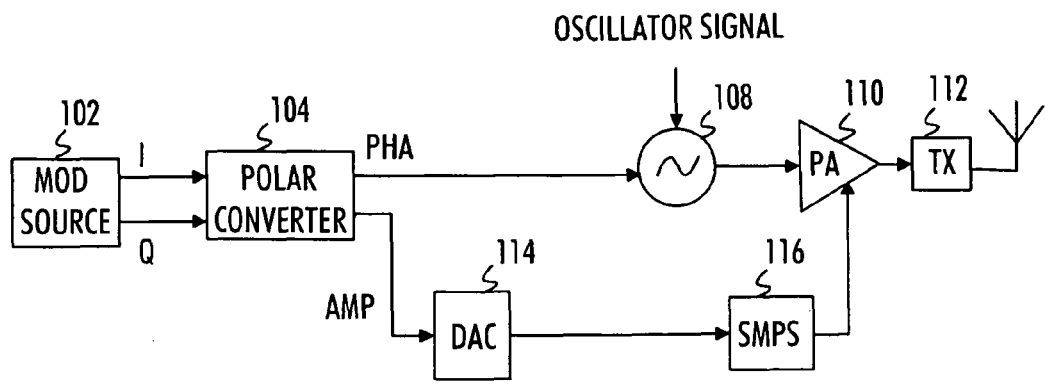

A general structure of a polar transmitter is illustrated in FIG. 1. The polar transmitter includes a modulation source 102 providing data symbols to be transmitted through a radio interface to a receiver side. The modulation source may output the symbols as a transmission signal which may be in the form of a complex digital signal comprising an in-phase (I) component and a quadrature (Q) component. The I and Q components of the transmission signal are applied to a polar converter 104 which converts the I and Q components into an amplitude component (AMP) and a phase component (PHA). The amplitude component carries the amplitude information of the transmission signal, while the phase component carries the phase information of the transmission signal. The amplitude component is applied to an amplitude path, and the phase component is applied to a phase path of the polar transmitter.

The digital phase component is phase-modulated from a digital baseband signal to an analog radio frequency signal in a phase modulator 108. In the phase modulator 108, the phase component phase-modulates an oscillator signal provided by a local oscillator, such as a phase-locked loop, and the frequency of the oscillator signal defines the (central) radio frequency of the up-converted phase component. The phase modulation may be implemented through direct conversion in which a real and an imaginary part of the complex-valued phase component having unity amplitude and the time-varying phase is mixed with an in-phase and a quadrature component of a radio-frequency oscillator signal provided by the local oscillator. Another example of the phase modulation is direct digital synthesis of an intermediate-frequency (IF) signal with constant amplitude and time-varying phase using a numerically controlled oscillator (NCO), converting the digital IF phase component into an analog signal using a digital-to-analog converter, and up-converting the analog IF phase component to a radio frequency by mixing with a local oscillator signal. Yet another example of the phase modulation includes varying the frequency of a phase-locked loop controlling the local oscillator with the time derivative of the phase component. Naturally, these are only examples of the phase-modulation, not limiting the invention by any means. Then, the up-converted analog phase component is applied to a power amplifier 110 for amplification.

The digital amplitude component of the transmission signal is converted into an analog amplitude component in a digital-to-analog converter 114. Then, the analog amplitude component is applied to a switched-mode power supply (SMPS) unit 116 configured to provide the power amplifier 110 with a power supply signal. The switched-mode power supply unit 116 supplies the power supply signal under the control of the input analog amplitude component. Accordingly, the power supply signal provided by the switched-mode power supply unit 116 follows the amplitude levels of the amplitude component. As a consequence, the phase-modulated radio frequency signal is amplitude-modulated with the power supply signal and amplified in the power amplifier 110. Then, the power-amplified transmission signal output from the power amplifier 110 is applied to a transmission circuitry 112 and transmitted through an antenna. The transmission circuitry 112 may include general analog components following the power amplifier in a radio transmitter, and the components may be selected according to the design of the transmitter. Above, the SMPS unit 116 is described only as an exemplary power supply unit for the power amplifier 110. Other possible power supply units include a linear power supply unit, a combination of the linear power supply and the SMPS power supply unit, and another circuit configuration capable of combining the amplitude component with the phase component in cooperation with the power amplifier 110. In case of a combination of the linear power supply and the SMPS power supply unit, the two power supply units may be arranged either in series or in parallel.

The polar transmitter described above with reference to FIG. 1 may include additional components, such as a low-pass filter configured to filter spurious signal components resulting from the conversion in the DAC 114. Additionally, the amplitude path may include a delay element configured to compensate for different delays between the amplitude path and the phase path. The difference in delays is caused by different signal processing operations, among others.

Figure 6:
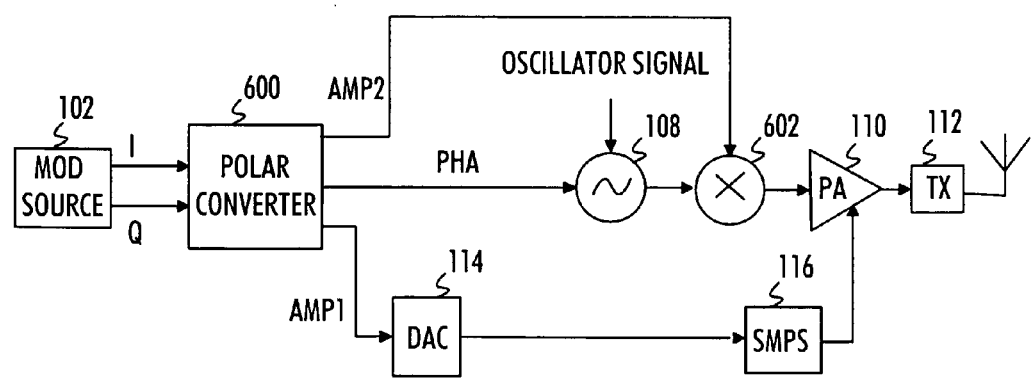
FIG. 6 illustrates another embodiment of the polar transmitter structure.

The polar transmitter illustrated in FIG. 1 implements a general envelope-elimination-and-restoration-transmitter structure based on the "Kahn scheme". FIG. 6 illustrates another implementation of the polar transmitter, in which the polar converter 600 converts the I and Q components of the transmission signal into one phase component PHA and two amplitude components AMP1 and AMP2, wherein the amplitude components AMP1 and AMP2 obey the following equations:

$$AMP1 \times AMP2 = \sqrt{I^2 + Q^2}, \text{ and} \quad (1)$$

$$AMP1 > TH1, \quad (2)$$

where TH1 is a predetermined threshold which may define a minimum power supply voltage input into the power amplifier 110. Accordingly, a first amplitude component AMP1 carries a portion of the amplitude information of the transmission signal, while the rest of the amplitude information of the transmission signal may be carried in the phase path by a second amplitude component input to a scaling unit 602 implemented by a multiplier, for example. The scaling unit may be arranged between the phase modulator 108 and the power amplifier to scale (or amplitude-modulate) the phase component. The first amplitude component AMP1 may be arranged to have a level which causes the SMPS unit 116 to apply to the power amplifier 110 a power supply signal above a minimum level required by the power amplifier 110 for desired performance.

Figure 7:
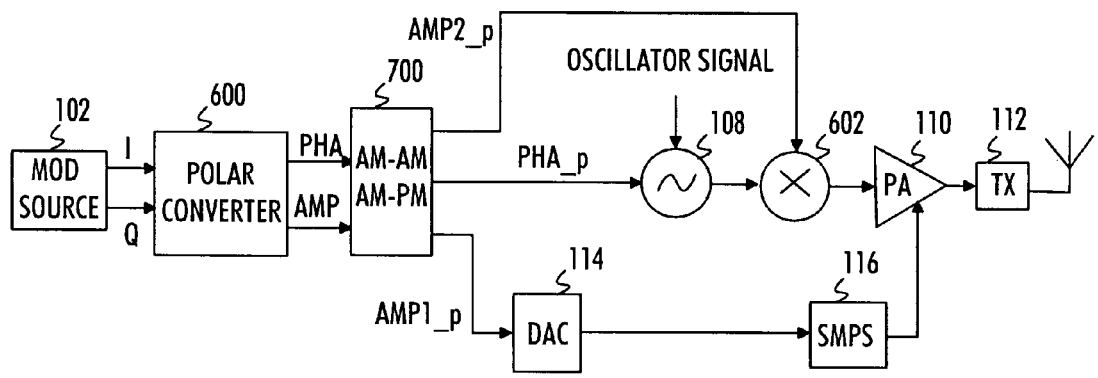
FIG. 7 illustrates yet another embodiment of the polar transmitter structure.

FIG. 7 illustrates yet another embodiment of the polar transmitter. This embodiment also splits the amplitude component of the transmission signal into two amplitude components AMP1 and AMP2, but it also implements predistortion of the amplitude component AMP and phase component PHA in a predistortion unit 700. The predistortion unit 700 may store lookup tables for amplitude and phase predistortion. The predistortion may be carried out in order to compensate for the predistortion caused by the power amplifier 110, for example. Accordingly, the amplitude and phase components AMP and PHA of the transmission signal are predistorted non-linearly in the predistortion unit 700 according to the known distortion properties of the power amplifier 110. An amplitude predistortion lookup table AM-AM may map each value of an input amplitude component to two amplitude values, wherein one value corresponds to an output value of a first predistorted amplitude component AMP1_$p$, and the other value corresponds to an output value of a second predistorted amplitude component AMP2_$p$. Similarly, a phase predistortion lookup table AM-PM may map each value of an input phase component to a phase value corresponding to an output value of a predistorted phase component PHA_$p$.

Figure 2:
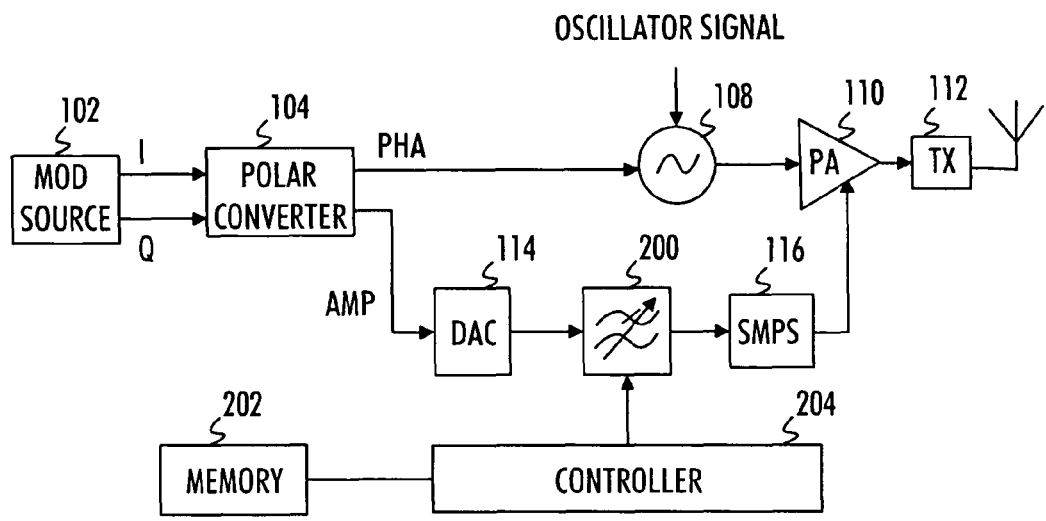
FIG. 2 illustrates a polar transmitter structure according to an embodiment of the invention.

FIG. 2 illustrates a polar transmitter structure including components according to an embodiment of the invention. The embodiment is equally applicable to any polar transmitter structure described above, and one skilled in the art is able to apply the embodiments described below also to other transmitter structures. The polar transmitter described below with reference to FIG. 2 is configured for use in a radio transmitter of a long-term evolution (LTE) version of UMTS (Universal Mobile Telecommunication System) specified within 3GPP ($3^{rd}$ Generation Partnership Project). The LTE version of the UMTS utilizes orthogonal frequency division multiple access (OFDMA) for downlink communications and single-carrier frequency division multiple access (SC-FDMA) for uplink communications. As known from the 3GPP specifications for the LTE, SC-FDMA is a modified version of the OFDMA multiple access scheme. The polar transmitter according to an embodiment of the invention may be implemented in a terminal of the LTE version of the UMTS, i.e. it may be configured to transmit single carrier radio signals.

With respect to the uplink communications in the LTE version of the UMTS, the frequency spectrum available for use in a cell is divided into transmission resource blocks, wherein each transmission resource block has a predetermined bandwidth, e.g. 180 kHz. Each transmission resource block may include a fixed number of subcarriers, and each subcarrier may have a bandwidth of 15 kHz. Accordingly, a transmission resource block may include 12 subcarriers. One or more transmission resource blocks may be allocated to a given terminal for transmission of data. In other words, the number of transmission resource blocks allocated to the terminal effectively defines the bandwidth and data rate allocated to the terminal. Accordingly, the bandwidth allocated to the terminal may be indicated as n*180 kHz, where n is the number of transmission resource blocks allocated to the terminal. The number of transmission resources available for allocation to the terminal may be up to 100, where n=100 gives bandwidth of 18 MHz.

FIG. 2 illustrates a polar transmitter structure in which the bandwidth of the amplitude path is limited according to an embodiment of the invention in order to suppress spurious signal components caused by noise in the amplitude path. Advantages obtained when suppressing the spurious signal components include improvement in the quality of uplink communications and in the capacity of the cell. The spurious signal components typically cause adjacent-channel leakage, which degrades the quality of communications on neighboring frequencies.

Referring to FIG. 2, the components having the same reference numerals as those in FIG. 1 may be corresponding components. In the embodiment illustrated in FIG. 2, the amplitude component of the transmission signal output from the polar converter 104 is low-pass filtered in a low-pass filter 200 having its filtering parameters defined according to the number of transmission resource blocks allocated to a terminal in which the polar transmitter of FIG. 2 is implemented. The low-pass filter 200 may be an analog low-pass filter located before the SMPS 116 in the amplitude path. In more detail, the low-pass filter 200 may be arranged between the DAC 114 and the SMPS 116.

The low-pass filter 200 may include at least one analog circuit component having its parameter values adjustable, thereby effectively adjusting the bandwidth of a pass band of the low-pass filter 200. The low-pass filter may be controlled by a controller 204. The operation of the controller 204 may be defined by software stored on a storage medium and read by the controller 204. Alternatively, the controller 204 may be implemented by an application-specific integrated circuit. Naturally, other implementations may also be feasible depending on the design of the terminal.

Figure 5:
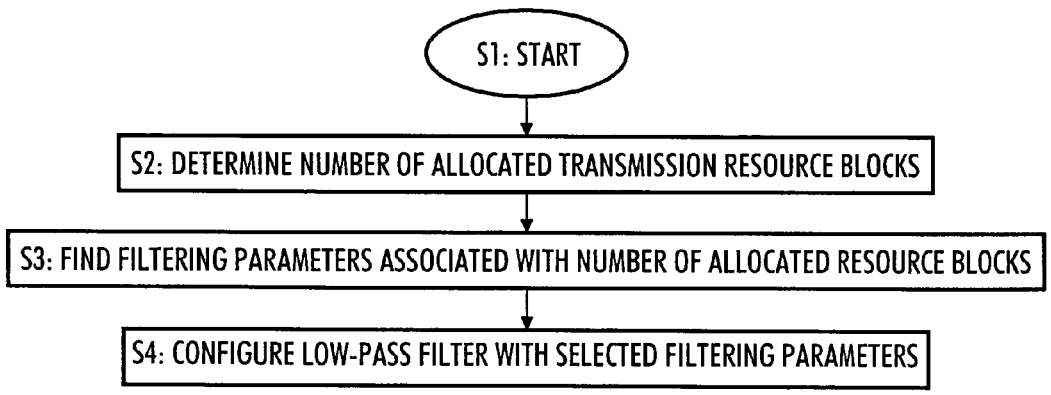
FIG. 5 is a flow diagram illustrating a process for configuring parameters of the polar transmitter according to an embodiment of the invention.

FIG. 5 illustrates a process for controlling the low-pass filter 200 according to an embodiment of the invention. The process may be executed as a computer process in the controller 204. The process starts in S1. In S2, the controller 204 determines the number of transmission resource blocks currently allocated to the terminal for use in uplink transmission. The controller 204 may determine the number of allocated transmission resource blocks from transmission parameters allocated to the terminal and stored in a memory unit 202 of the terminal. In S3, the controller finds filtering parameters associated with the number of allocated resource blocks determined in S2. For this purpose, the memory unit 202 may store a database where each number of allocated resource blocks is linked to a set of parameters. Each parameter set may include the filtering parameters for use in configuring the low-pass filter 200. Table 1 below illustrates an example of such a database. Referring to Table 1, a field indicating the number of allocated resource blocks being 1 is linked to parameter set #1, a field indicating the number of allocated resource blocks being 2 is linked to parameter set #2, etc. A similar link between the number of resource blocks and the corresponding parameter sets may be arranged for all numbers of resource blocks that can be allocated to the terminal. The database of Table 1 may be constructed in the design, production, and/or testing phase of the transmitter circuitry. Optimal parameter sets including the filtering parameters for each number of allocated transmission resource blocks may be determined, for example, from measured responses of the low-pass filter, and stored in the database of Table 1.

Accordingly, the controller 204 in S3 first searches the database for a field indicating the number of transmission resource blocks corresponding to the number of transmission resource blocks determined in S2. Then, the controller 204 searches for a parameter set linked to that field, i.e. to the number of allocated transmission resource blocks, and selects the parameter set found to be linked to the number of allocated transmission resource blocks.

TABLE 1

| Number of resource blocks | Filtering parameters |
|---|---|
| 1 | Parameter set #1 |
| 2 | Parameter set #2 |
| ... | ... |
| 100 | Parameter set #100 |

Figure 8:
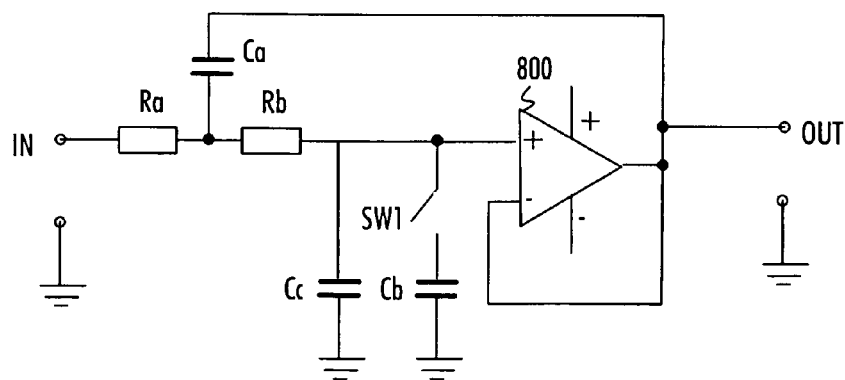
FIG. 8 illustrates a low-pass filter having parameters adjustable according to an embodiment of the invention.

In S4, the controller 204 configures the low-pass filter 200 with the filtering parameters. In practice, the filtering parameters may define one or more control signals to be applied to the low-pass filter 200 in order to tune the low-pass filter 200 to have desired properties. For example, the low-pass filter 200 may include a plurality of components selectable with one or more control signals provided by the controller 204. The components may be selectable, for example, by closing appropriate switches in the low-pass filter 200. Accordingly, the controller 204 may select determined component(s) of the low-pass filter to be connected into a circuit between an input node and output node of the low-pass filter 200, thereby configuring the low-pass filter 200 to have desired filtering properties, e.g. pass band bandwidth. The selection of the components of the low-pass filter may be defined by the parameter set selected in S3. FIG. 8 illustrates an active filter structure comprising a first resistor Ra connected to an input node IN, a second resistor Rb arranged between the first resistor Ra and a positive input of an operational amplifier 800. A first capacitor Ca is located at a feedback loop of the circuit and connected between the resistors Ra and Rb. A second capacitor Cb connected between the positive input node of the operational amplifier and the ground is selectively connected to the circuit by closing a switch SW1 connected to the second capacitor. A third capacitor Cc is connected in parallel with the second capacitor Cb, but the third capacitor may be constantly connected to the circuit. Accordingly, the controller 204 may selectively close the switch SW1 according to the selected filtering parameters so as to connect the second capacitor Cb to the circuit between the input node IN and an output node OUT of the low-pass filter circuitry. When the power of a signal processed in the filter circuit is high (as in the output stage of the SMPS unit 116), it is advantageous to connect switches to the ground at one end. However, for a small-signal node, as in the active filter described above, where the low-pass filter is arranged before the SMPS unit 116, the switch may also be located between two components of the low-pass filter circuit.

FIG. 8 illustrates a simplified filter having tunable filtering parameters, and actual implementations may be more complex depending on the number of different configurations needed for the low-pass filter 200. Alternatively, parameters of one or more components, e.g. one or more capacitors, of the low-pass filter 200 may be adjustable by the controller, and the degree of adjustment may be defined by the parameter set selected in S3.

An advantage of providing the analog low-pass filter 200 between the DAC 114 and the SMPS 116 is that the low-pass filter 200 filters signal components outside the bandwidth allocated to the terminal but also spurious signal components caused by non-idealities of the DAC 114 before the amplitude component is applied to the SMPS unit 116 for power supply signal generation. Additionally, high integration level of the low-pass filter 200 is achieved. If the low-pass filter were located after the SMPS unit 116, the low-pass filter 200 would have to handle high-level currents which would degrade the integration level of the low-pass filter 200.

Accordingly, the SMPS 116 generates a power supply signal for the power amplifier 110 from the low-pass filtered amplitude component. The low-pass filter 200 may be implemented in a separate integrated circuit, or it may be applied to the same integrated circuit together with the SMPS 116. Moreover, the low-pass filter 200 may be integrated into the circuitry of the SMPS 116, and the low-pass filtering may be carried out before or during the generation of the power supply signal under the control of the amplitude component. In an embodiment where the low-pass filter is integrated into the SMPS unit 116, the feedback loop of the SMPS unit 116 may be configured to perform the low-pass filtering with the selected filtering parameters. The low-pass filtering may be performed by arranging a filter either in a feed-forward path or in a feedback path of the SMPS unit 116. Furthermore, the low-pass filter 200 may be implemented in the same integrated circuit together with the DAC 114.

Figure 3:
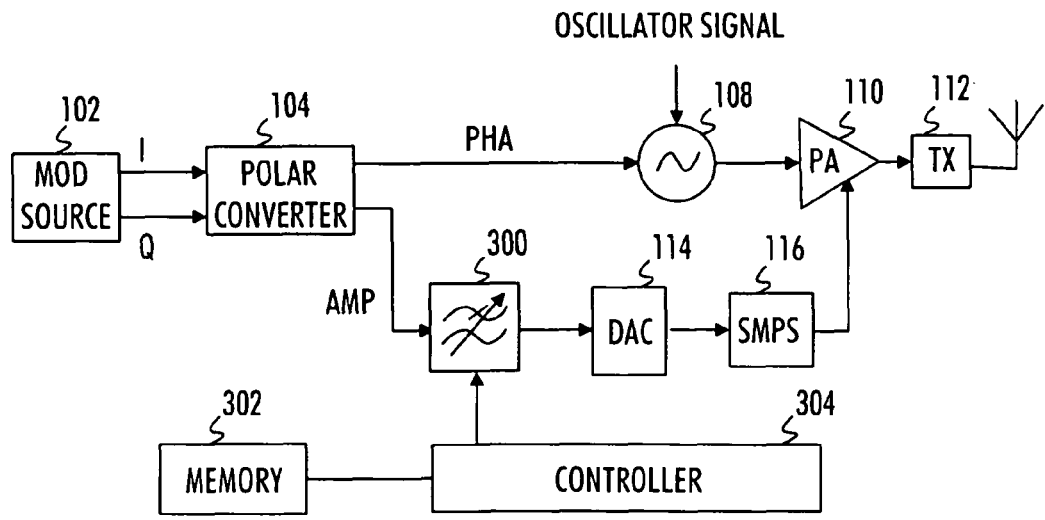
FIG. 3 illustrates a polar transmitter structure according to another embodiment of the invention.

FIG. 3 illustrates another embodiment of the invention in which the low-pass filter is a digital low-pass filter 300 located before the DAC 114 in the amplitude path of the polar transmitter. The low-pass filter 300 may be a finite impulse response (FIR) filter or an infinite impulse response (IIR) filter. The low-pass filter 300 is controlled by a controller 304 having functionality slightly different from that of the controller 204 of FIG. 2 in the sense that the controller 304 now controls a digital low-pass filter. In other words, the controller 304 selects filtering parameters including coefficients for the low-pass filter 300. The process described above with reference to FIG. 5 may be modified to accommodate this embodiment. According to this embodiment, the controller 304 selects the coefficients for the low-pass filter 300 according to the number of transmission resource blocks allocated to the terminal for the uplink communications. Steps S1 and S2 may be similar to those described above. In S3, the controller 304 checks a memory unit 302 for filtering parameters linked to the determined number of allocated transmission resource blocks. The memory unit 302 may store the database of Table 1, wherein the database may be modified such that each filtering parameter set includes low-pass filter coefficients for the digital low-pass filter 300. Accordingly, the controller 304 finds in S3 coefficients linked to the determined number of allocated transmission resource blocks from the database stored in the memory unit 302 and selects the coefficients as the filtering parameters for the digital low-pass filter 300. In S4, the controller 304 configures the digital low-pass filter 300 with the selected coefficients, i.e. applies the selected coefficients to the low-pass filter 300.

In the embodiment described above with reference to FIG. 3, the compensation for the variable delay between the amplitude path and the phase path may be integrated into the low-pass filter 300, and the variable delay may be taken into account in the filtering parameters stored in the database of Table 1. Accordingly, the low-pass filter 300 may perform both low-pass filtering and the delay compensation under the control of the controller 304. The advantage of this embodiment is the reduction of the components needed in the polar transmitter, because a single low-pass filter 300 may perform the two operations.

Another embodiment may be derived from the embodiment described above with reference to FIG. 2. The low-pass filter 200 is not necessarily an ideal component, and it may distort the amplitude component by introducing group delay distortion, pass-band voltage ripple, and/or nominal delay in the amplitude component. These distortions may depend on the parameters configuring the low-pass filter 200. These distortions may be compensated for in an embodiment described below with reference to FIG. 4.

Figure 4:
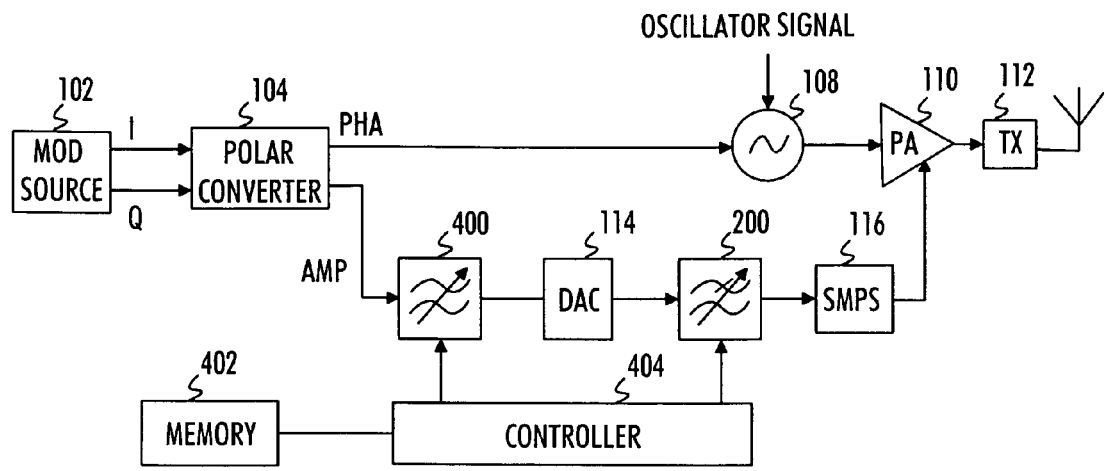
FIG. 4 illustrates a polar transmitter structure according to an embodiment of the invention derived from the embodiment of FIG. 2.

Referring to FIG. 4, the low-pass filter 200 is provided between the DAC 114 and the SMPS unit 116, as in the embodiment of FIG. 2. The filtering parameters for the low-pass filter 200 may be selected by a controller 404 as described above with reference to FIG. 2. Accordingly, the controller 404 configures the low-pass filter 200 with the filtering parameters selected according to the number of transmission resource blocks allocated to the terminal for uplink communications. Additionally, an equalizer 400 is arranged before the DAC 114 in the form of a digital filter. The equalizer may be a poly-phase FIR filter or a poly-phase IIR filter, depending on the design of the polar transmitter according to this embodiment. The controller 404 may select weighting parameters including filter coefficients for the equalizer 400 according to the number of transmission resource blocks allocated to the terminal for uplink communications.

The process of FIG. 5 may be modified for this embodiment, as described below. Steps S1 and S2 may be carried out, as described above, and steps S3 and S4 may be carried out for the selection of the filtering parameters for the low-pass filter, as described above in conjunction with the embodiment of FIG. 2. Steps S3 and S4 and the database of Table 1 are, however, modified to incorporate the weighting parameters for the equalizer 400. In S3, the controller 404 checks a memory unit 402 for filtering parameters and weighting parameters associated with the number of transmission resource blocks allocated to the terminal for the uplink communications. The parameters are stored in the database of Table 1, in which each parameter set includes filtering parameters for the low-pass filter 200 and weighting parameters for the equalizer 400, wherein the filtering parameters and weighting parameters in each parameter set are determined to be optimal for the number of transmission resource blocks linked to a given parameter set in the database. Accordingly, the controller 404 selects in S3 the filtering parameters and the weighting parameters from the parameter set linked to the number of allocated transmission resource blocks determined in S2.

In S4, the controller 404 configures the low-pass filter 200 with the filtering parameters and the equalizer 400 with the weighting parameters selected in S3. Accordingly, the controller 404 may apply to the equalizer 400 coefficients comprised in the selected parameter set and, as a consequence, the equalizer 400 weights the amplitude component with the coefficients provided by the controller 404.

The weighting parameters for different numbers of transmission resource blocks may be determined during the design, production, and/or testing phase of the transmitter circuitry. For example, a response of the low-pass filter configured by given filtering parameters linked to a given number of transmission resource blocks may be measured, and the distortion caused by the low-pass filter may be determined from the measured response. Then, coefficients to compensate for the distortion may be calculated and stored in a parameter set in the database, the parameter set being linked to the number of transmission resource blocks in question. For example, group delay distortion, pass band ripple, and nominal delay of the low-pass filter and the whole amplitude path may be measured for different numbers of transmission resource blocks, and the weighting parameters compensating for the measured group delay distortion, pass band ripple, and nominal delay may be calculated and stored in the database. As a consequence, the compensation for the variable delay between the amplitude path and the phase path may be integrated into the equalizer 400, and the variable delay may be taken into account in the weighting parameters stored in the database of Table 1. Accordingly, the equalizer 400 may perform both compensation for the distortion caused by the low-pass filter 200 and the delay compensation of the amplitude path under the control of the controller 404.

In further embodiments, the low-pass filter 300 of FIG. 3 and/or the equalizer 400 of FIG. 4 may be modified to incorporate decimation operation in order to reduce the sampling rate of the digital amplitude component before the amplitude component is applied to the DAC 114. Reduction in the sampling rate of a DAC results in reduced processing in the DAC and, as a consequence, reduction in the power consumption of the DAC. In order to carry out the decimation, the low-pass filter 300 and/or the equalizer 400 may be configured to incorporate a digital polyphase filter carrying out the decimation by converting m input samples into n output samples, wherein n<m, thereby carrying out decimation by a factor of m/n. The actual decimation operation with, for example, a polyphase filter as such is well-known in the art and, therefore, it is not described herein in greater detail.

In the embodiment utilizing the decimation, the decimation factor n/m may be made variable according to the number of transmission resource blocks allocated to the mobile terminal for the uplink communications. Accordingly, the parameters for the decimation operation may be stored in the database of Table 1 for each number of transmission resource blocks. The idea is to have a minimum sampling rate possible for each number of transmission resource blocks so that the DAC 114 may be operated at the lowest possible sampling rate, thereby optimizing the power consumption of the DAC 114.

In the embodiment of FIG. 3, the decimation parameters may be included in the filtering parameters for the low-pass filter 300 so that the low-pass filter 300 performs both low-pass filtering and decimation operations. The low-pass filter 300 may include a polyphase filter structure configured to perform both low-pass filtering and the decimation simultaneously, or the low-pass filter 300 may include a low-pass filter section performing the low-pass filtering and a decimation section performing the decimation. The same applies to the embodiment of FIG. 4, i.e. the equalizer 400 operates as a digital filter configured by the filtering parameters calculated so as to suppress spurious components caused by the low-pass filter, and as a decimation filter performing the decimation. The analog low-pass filter 200 functions in this embodiment also as an anti-aliasing filter for the DAC 114.

In the operation, the controller 304 or 404 reads from the memory unit 302 or 402 the filtering parameters including the decimation parameters corresponding to the number of allocated transmission resource blocks and configures the low-pass filter 300 or the equalizer 400 with the parameters. Additionally, the controller may control the sampling rate of the DAC 114 to match with the sampling rate of the input amplitude component decimated in the low-pass filter 300 or equalizer 400. Accordingly, the database of Table 1 may also store sampling parameters for the DAC 114 for each number of transmission resource blocks, and the controller 304 or 404 may read from the database the sampling parameters associated with the number of allocated transmission resource blocks and control the DAC 114 (or a clock generator of the DAC 114) according to the selected sampling parameters.

The processes or methods described with reference to FIG. 5 may also be carried out in the form of a computer process defined by a computer program. The computer program may be in source code form, object code form, or in some intermediate form, and it may be stored in some sort of carrier, which may be any entity or device capable of carrying the program. Such carriers include a record medium, computer memory, read-only memory, electrical carrier signal, telecommunications signal, and software distribution package, for example. Depending on the processing power needed, the computer program may be executed in a single electronic digital processing unit or it may be distributed amongst a number of processing units.

The present invention is applicable to cellular or mobile telecommunication transmitters but also to other suitable radio transmitters. It will be obvious to a person skilled in the art that, as technology advances, the inventive concept can be implemented in various ways. The invention and its embodiments are not limited to the examples described above but may vary within the scope of the claims.

The invention claimed is:

1. A method, comprising:
   obtaining an amplitude component of a transmission signal including transmission symbols distributed to a bandwidth allocated to a radio transmitter for transmission;
   selecting filtering parameters according to the bandwidth;
   low-pass filtering the amplitude component in a low-pass filter configured by the selected filtering parameters; and
   using the low-pass filtered amplitude component in power supply of a power amplifier configured to power-amplify a phase component of the transmission signal.

2. The method of claim 1, further comprising: generating, in a power supply unit, a power supply signal for the power amplifier from the low-pass filtered amplitude component.

3. The method of claim 1, further comprising:
   determining the bandwidth from transmission parameters allocated to the radio transmitter for transmission of the transmission signal; and
   checking a memory unit for filtering parameters associated with the determined bandwidth.

4. The method of claim 1, further comprising: adjusting parameters of at least one analog circuit component of the low-pass filter with the filtering parameters selected according to the bandwidth,
   wherein the low-pass filter includes the at least one analog circuit component having adjustable parameters.

5. The method of claim 1, further comprising: selectively connecting determined circuit components of the low-pass filter into a circuit between an input node and an output node according to the bandwidth,
   wherein the low-pass filter includes the circuit components connectable into the circuit between the input node and the output node of the low-pass filter.

6. The method of claim 1, further comprising: configuring a feedback loop of a power supply unit to perform the low-pass filtering with the selected filtering parameters, wherein the power supply unit is configured to generate a power supply signal for the power amplifier.

7. The method of claim 1, further comprising: selecting the filtering parameters including coefficients for the low-pass filter according to the bandwidth,
   wherein the low-pass filter is a digital low-pass filter.

8. The method of claim 7, further comprising: configuring the digital low-pass filter to compensate for delay of the amplitude component with respect to the phase component, wherein the amplitude component and the phase component are applied to the power amplifier through different paths.

9. The method of claim 7, further comprising:
   determining a decimation factor according to the bandwidth; and
   decimating a sampling rate of the amplitude component in the digital low-pass filter configured by the determined decimation factor.

10. The method of claim 1, wherein the low-pass filter is integrated into a power supply unit configured to generate a power supply signal for the power amplifier from the low-pass filtered amplitude component.

11. The method of claim 1, further comprising:
   selecting weighting parameters according to the bandwidth; and
   weighting the amplitude component in an equalizer configured by the weighting parameters.

12. The method of claim 11, further comprising:
   measuring signal distortion properties of the low-pass filter with different bandwidths;

determining the weighting parameters for each bandwidth from the measured signal distortion properties of the low-pass filter; and storing, in a memory unit, the determined weighting parameters with a link to the corresponding bandwidth.

13. The method of claim 11, further comprising: configuring the equalizer with the weighting parameters to compensate for at least one of the following type of distortion caused by the low-pass filter: group delay distortion, pass-band voltage ripple, and nominal delay of the amplitude component with respect to the phase component.

14. An apparatus comprising:
a low-pass filter comprising an input node configured to obtain an amplitude component of a transmission signal including transmission symbols distributed to a bandwidth allocated to a radio transmitter for transmission; and
a controller configured to select filtering parameters according to the bandwidth and to configure the low-pass filter with the selected filtering parameters to low-pass filter the amplitude component, wherein the low-pass filtered amplitude component is for use in power supply of a power amplifier configured to power-amplify a phase component of the transmission signal.

15. The apparatus of claim 14, wherein the low-pass filter further comprises an output node operationally connectable to an input node of a power supply unit configured to generate a power supply signal for the power amplifier from the low-pass filtered amplitude component.

16. The apparatus of claim 14, wherein the controller is further configured to determine the bandwidth from transmission parameters allocated to the radio transmitter for transmission of the transmission signal and to check a memory unit for filtering parameters associated with the determined bandwidth.

17. The apparatus of claim 14, wherein the low-pass filter further comprises at least one analog circuit component having adjustable parameters, and the controller is further configured to adjust the parameters of the at least one analog circuit component with the filtering parameters selected according to the bandwidth.

18. The apparatus of claim 15, wherein the low-pass filter further comprises circuit components connectable into a circuit between the input node and an output node of the low-pass filter, and the controller is further configured to selectively connect determined circuit components of the low-pass filter into the circuit between the input node and the output node according to the resource blocks bandwidth.

19. The apparatus of claim 14, wherein the apparatus further comprises a power supply unit configured to generate a power supply signal for the power amplifier, and the controller is configured to configure a feedback loop of the power supply unit to perform the low-pass filtering with the selected filtering parameters.

20. The apparatus of claim 14, wherein the low-pass filter is a digital low-pass filter and the controller is further configured to select the filtering parameters including coefficients for the digital low-pass filter according to the bandwidth.

21. The apparatus of claim 20, wherein the controller is further configured to configure the digital low-pass filter to compensate for delay of the amplitude component with respect to the phase component, wherein the amplitude component and the phase component are applied to the power amplifier through different paths.

22. The apparatus of claim 20, wherein the controller is further configured to determine a decimation factor according to the bandwidth and to configure the digital low-pass filter to decimate a sampling rate of the amplitude component with the determined decimation factor.

23. The apparatus of claim 14, wherein the apparatus further comprises a power supply unit configured to generate a power supply signal for the power amplifier from the low-pass filtered amplitude component, and the low-pass filter is an analog filter integrated into the power supply unit.

24. The apparatus of claim 14, wherein the apparatus further comprises an equalizer, and the controller is further configured to select weighting parameters according to the bandwidth and to configure the equalizer with the weighting parameters to weight the amplitude component.

25. The apparatus of claim 24, wherein the apparatus further comprises a memory unit configured to store information, and the weighting parameters have been determined beforehand for each bandwidth from measured signal distortion properties of the low-pass filter and stored beforehand into the memory unit with a link to the corresponding bandwidth.

26. The apparatus of claim 24, wherein the controller is further configured to configure the equalizer with the weighting parameters to compensate for at least one of the following type of distortion caused by the low-pass filter: group delay distortion, pass-band voltage ripple, and nominal delay of the amplitude component with respect to the phase component.

27. An apparatus, comprising:
means for obtaining an amplitude component of a transmission signal including transmission symbols distributed to a bandwidth allocated to a radio transmitter for transmission;
means for selecting filtering parameters according to the bandwidth; and
low-pass filtering means for low-pass filtering the amplitude component configured by the selected filtering parameters, wherein the low-pass filtered amplitude component is for use in power supply of a power amplifier configured to power-amplify a phase component of the transmission signal.

28. A computer program product embodied on a distribution medium readable by a computer and comprising program instructions which, when loaded into a computer, execute a computer process, comprising:
selecting filtering parameters according to a bandwidth allocated to a radio transmitter for transmission;
configuring a low-pass filter with the selected filtering parameters to low-pass filter an amplitude component of a transmission signal, wherein the low-pass filtered amplitude component is for use in power supply of a power amplifier configured to power-amplify a phase component of the transmission signal.

29. The computer program product of claim 28, the computer process further comprising:
determining the bandwidth from transmission parameters allocated to the radio transmitter for transmission of the transmission signal; and
checking a memory unit for filtering parameters associated with the determined bandwidth.

* * * * *